United States Patent [19]

Prokopp

[11] Patent Number: 4,963,822
[45] Date of Patent: Oct. 16, 1990

[54] METHOD OF TESTING CIRCUIT BOARDS AND THE LIKE

[76] Inventor: Manfred Prokopp, Am Felder 27, D-6980 Wertheim-Reicholzheim, Fed. Rep. of Germany

[21] Appl. No.: 358,441

[22] Filed: May 26, 1989

[30] Foreign Application Priority Data

Jun. 1, 1988 [DE] Fed. Rep. of Germany ....... 3818686

[51] Int. Cl.$^5$ .......................... G01R 1/06; G01R 31/02
[52] U.S. Cl. ................................ 324/158 P; 324/72.5; 324/158 F
[58] Field of Search ............... 324/158 F, 158 P, 72.5, 324/73 PC

[56] References Cited

U.S. PATENT DOCUMENTS

| 4,423,376 | 12/1983 | Byrnes et al. | 324/158 F |
| 4,622,514 | 11/1986 | Lewis | 324/72.5 |

FOREIGN PATENT DOCUMENTS

| 3123627 | 12/1982 | Fed. Rep. of Germany |  |
| 0035382 | 2/1989 | Japan | 324/158 P |

OTHER PUBLICATIONS

Lipschutz et al.; "Buckling . . . "; IBM Tech. Dis. Bull.; vol. 15; No. 10; Mar. 1973; pp. 3032–3034.

Primary Examiner—Ernest F. Karlsen
Attorney, Agent, or Firm—Peter K. Kontler

[57] ABSTRACT

Circuit boards, chips and analogous components having a large number of electric contacts are contacted with an adapter wherein the rear ends of elongated flexible resilient test probes are affixed to a plate-like support and the front ends of the probes extend or can extend beyond the holes of a front plate which is maintained at a fixed distance from the support. Intermediate portions of the probes extend with play through openings in a plate-like flexing member which is movable by a fluid-operated motor in a first direction in parallelism with the front plate to flex the probes preparatory to placing of the front plate and a component to be tested next to each other so that the contacts of the component engage or are adjacent the front ends of the probes. The flexing member thereupon permits the probes to dissipate or to tend to dissipate at least some of the stored energy and urge their front ends against the adjacent contacts. The flexing member can be positively moved in a second direction counter to the first direction to flex the probes in the second direction while the front ends of the probes already bear against the adjacent contacts. This increases the pressure between the front ends and the contacts.

7 Claims, 1 Drawing Sheet

METHOD OF TESTING CIRCUIT BOARDS AND THE LIKE

BACKGROUND OF THE INVENTION

The invention relates to a method of and to an apparatus for testing circuit boards, integrated circuits, wired circuits, chips and like components which are provided with arrays of electric contacts. More particularly, the invention relates to improvements in methods of and in apparatus for testing circuit boards and like components with flexible test probes. Still more particularly, the invention relates to improvements in methods of and in apparatus for testing circuit boards and like components with test probes which are installed in an adapter serving as a means for connecting the contacts of the component to be tested with the conductors of a testing unit.

German Offenlegungsschrift No. 31 23 627 to Brabetz et al. discloses an adapter wherein an array of flexible resilient test probes, called pins, is installed in a housing having a front wall with holes for the front ends of the pins, a rear wall which is secured to the rear ends of the pins, and a mobile intermediate wall, called flexing plate, which is disposed between the front and rear walls and has openings slidably receiving median portions of the pins. The front end portions of the pins are slidable in the front wall and their tips serve to engage the adjacent contacts (e.g., contacts in the form of so-called pads) on a circuit board or a like component which is positioned adjacent the front wall. The housing contains a stop for the flexing plate, and the position of the stop is selected in such a way that the flexing plate maintains the pins in deformed condition when it is permitted to abut the stop. This ensures that the deformed resilient pins tend to dissipate energy and urge the tips of their front end portions into engagement with the contacts of the component to be tested. The flexing plate is moved away from the stop in response to depression of the tips of front end portions of pins by the contacts of a component to be tested whereby the pins store energy and tend to move the flexing plate back toward the stop. When the testing operation is completed and the distance of the front plate of the adapter housing from the freshly tested component is increased, the pins are free to dissipate energy and to return the flexing plate into engagement with the stop. As mentioned above, the flexing plate compels the pins to store a certain amount of energy when the adapter is not in use because the flexing plate is arrested by the stop before any of the pins can assume its unstressed condition.

It is normally desirable to ensure that the tips of the front end portions bear upon the adjacent contacts with a relatively large force because this ensures the establishment of reliable electrical connections between the contacts and the respective inputs of the testing unit. In order to ensure the establishment of reliable electrical connections, it is often necessary that the tips penetrate through oxide layers and/or through layers of contaminants at those sides of the contacts which confront the adjacent pins. As a rule, an adapter will comprise at least several hundred and often many thousand pins; therefore, it is necessary to exert upon the tips of the front end portions of pins a very large force which should ensure that the tips will indeed penetrate through layers of oxide and/or through layers of contaminants for the purpose of establishing a reliable electrical connection between each contact and the adjacent pin. Such forces are normally applied by a strong and large motor which is designed to move the housing of the adapter toward the component to be tested and/or vice versa. The motor contributes significantly to the initial and maintenance cost as well as to the bulk of the adapter of Brabetz et al.

OBJECTS OF THE INVENTION

An object of the invention is to provide a method of testing circuit boards, chips and like components in such a way that only a relatively small force is required to ensure satisfactory engagement of each contact of the component to be tested with the adjacent test probe.

Another object of the invention is to provide a method which renders it possible to vary the magnitude of forces acting between the contacts of a component to be tested and the tips of flexible resilient test probes in a simple, reliable and reproducible manner.

A further object of the invention is to provide a method which can be practiced with a simple, compact and inexpensive adapter.

An additional object of the invention is to provide a method which can be relied upon in connection with the testing of a wide variety of components having arrays of electric contacts in the form of pads, legs, wires or the like.

Still another object of the invention is to provide a novel and improved adapter for use in connection with the practice of the above outlined method.

A further object of the invention is to provide an adapter which can be caused to move its flexible resilient test probes into satisfactory engagement with the contacts of a component to be tested irrespective of whether the component carries a relatively small number, a medium large number or a very large number of electric contacts.

An additional object of the invention is to provide the adapter with novel and improved means for controlledly deforming its test probes.

Another object of the invention is to design the adapted in such a way that its test probes can be caused to gradually or abruptly engage the adjacent contacts of a component to be tested.

A further object of the invention is to provide the adapter with a novel and improved housing and with novel and improved means for regulating the force with which the tips of its test probes engage the contacts.

An additional object of the invention is to provide an adapter which can be put to use in available testing apparatus as a superior substitute for heretofore known adapters.

Another object of the invention is to provide a testing apparatus which embodies the above outlined adapter.

An additional object of the invention is to provide the apparatus with novel and improved means for positioning circuit boards or other components to be tested with reference to the adapter.

SUMMARY OF THE INVENTION

One feature of the present invention resides in the provision of a method of contacting circuit boards, chips and analogous components having a plurality of electric contacts with elongated flexible resilient probes each of which has a contact-engaging front end. The method comprises the steps of reciprocably guiding the probes in first regions adjacent their front ends, supporting the probes in second regions which are remote from the front ends against movement toward the first regions, flexing the probes intermediate the first and second regions in a predetermined direction with a predetermined force to thereby retract the front ends toward the second regions and to cause the thus flexed probes to store energy, positioning the retracted front ends and the contacts of the component to be tested close to or in actual contact with each other, and reducing or terminating the application of the force to thus enable the front ends to bear against the contacts of the component to be tested due to the tendency of probes to dissipate stored energy. The force terminating or reducing step can include moving the probes intermediate the first and second regions in a second direction substantially counter to the predetermined direction. As mentioned above, the force can be reduced to zero so that the front ends of the probes bear against the contacts of the component to be tested exclusively due to the tendency of probes to dissipate stored energy. If the pressure between the front ends of the probes and the contacts of the component to be tested is to be increased, the method further comprises the step of applying to the probes a second force between the first and second regions in a direction substantially counter to the predetermined direction in order to urge the front ends against the contacts of the component to be tested with a force greater than that developing as a result of the tendency of probes to dissipate energy which was stored in the course of the flexing step. Thus, the front ends of the probes can exert against the contacts of the component to be tested a pressure which matches the maximum pressure the front ends of the probes can exert as a result of their tendency to dissipate energy, a pressure which is less than such maximum pressure, or a pressure which exceeds such maximum pressure, depending upon the extent and direction of flexing of probes between the first and second regions at the time the front ends of the probes engage the adjacent contacts. The force reducing step can include reducing the force by less than 100 percent; this ensures that the probes exert against the adjacent contacts a pressure which is less than maximum pressure the probes can exert due to their tendency to dissipate stored energy.

The method can further comprise the step of maintaining the component to be tested at a fixed distance from the second regions in the course of the force reducing step. Alternatively, the component to be tested can be yieldably biased against the front ends during and upon completion of the force reducing step.

Another feature of the invention resides in the provision of an adapter which can be used for contacting circuit boards, chips and analogous components having a plurality of electric contacts. The adapter comprises an array of elongated flexible resilient test probes each having a front end engageable with a contact of a component to be tested and a rear end, a support which is connected with the rear ends of the probes, bearings disposed at a predetermined distance from the support and reciprocably receiving the probes in the regions of the front ends, and means for flexing the probes intermediate the bearings and the support. The flexing means includes a flexing member having openings for the probes, and means for moving the flexing member in a predetermined direction substantially transversely of the probes to thereby flex the probes intermediate the support and the bearings and to draw the front ends of the probes toward the flexing member.

The bearings can constitute portions of a first plate and the support can include or constitute a second plate. The flexing member can include or constitute a third plate which is parallel to at least one of the other two plates. The first plate can be provided with parallel holes 113 for portions of the probes, and the moving means can include a motor (e.g., a fluid-operated motor) which serves to move the flexing member in substantial parallelism with the first plate.

The adapter can further include means for confining the flexing member to movements in and substantially counter to the predetermined direction. Such confining means can include sidewalls forming part of a housing which further includes the first and second plates and confines the major portions of the probes.

The adapter can further comprise means for moving the flexing member in a direction substantially counter to the predetermined direction. Such moving means can include one or more springs or the aforementioned motor if the latter is of the double-acting type. It is also possible to move the flexing member in and/or counter to the predetermined direction by a manually operable input element (e.g., a crank or a wheel) which is connected with the flexing member by a suitable transmission.

Once the probes are flexed as a result of movement of the flexing member in the predetermined direction, they store energy and tend to move the flexing member counter to the predetermined direction and to thereby move their front ends away from the support and from the flexing member. If the motor permits the flexing member to move counter to the predetermined direction, the probes are free to dissipate energy until and unless prevented to do so by the contacts of the component to be tested, i.e., when the front ends of the probes bear against the adjacent contacts. The means for moving the flexing member in the second direction (i.e., substantially counter to the predetermined direction) can be designed to move the flexing member beyond the position which the flexing member assumes when the dissipation of energy by the probes is prevented by the contacts of the component to be tested. By moving beyond such position, the flexing member flexes the intermediate portions of probes in the second direction and causes the probes to store additional energy at a time the front ends of the probes already engage the adjacent contacts. In other words, the probes then store some energy which was stored as a result of initial flexing (i.e., as a result of movement of the flexing member in the predetermined direction) and all of the energy which is stored as a result of movement of the flexing member in the second direction subsequent to engagement between the front ends of the probes and the respective contacts of the component to be tested.

At least those portions of the probes which extend through the openings of the flexing member can have a circular cross-sectional outline (i.e., they can constitute rods), and the width of the openings in the flexing member (as measured in the predetermined and second directions) is preferably at least 1.5D, most preferably at least 3D, D being the diameters of rod-shaped portions of the probes.

The adapter can be further provided with suitable stops (which may but need not be adjustable) which limit the extent of movability of the flexing member in the second direction.

One of the moving means can be at least partially confined in the other moving means. For example, if the means for moving the flexing member in the predetermined direction comprises a fluid-operated motor and the means for moving the flexing member in the second direction comprises a coil spring, the spring can be installed in the cylinder of the motor.

The adapter further comprises means (e.g., a valve) for deactivating the means for moving the flexing member in the predetermined direction so that the flexed probes are free to dissipate energy which is stored as a result of flexing and to move the flexing member in the second direction until prevented by the contacts of the component to be tested. Such adapter can further comprise means for regulating the speed of movement of the flexing member in the second direction; the regulating means can comprise an adjustable throttle valve which controls the rate of escape of fluid from the fluid-operated motor.

The novel features which are considered as characteristic of the invention are set forth in particular in the appended claims. The improved adapter itself, however, both as to its construction and its mode of operation, together with additional features and advantages thereof, will be best understood upon perusal of the following detailed description of certain presently preferred specific embodiments with reference to the accompanying drawing.

DESCRIPTION OF PREFERRED EMBODIMENTS

Figure 1:
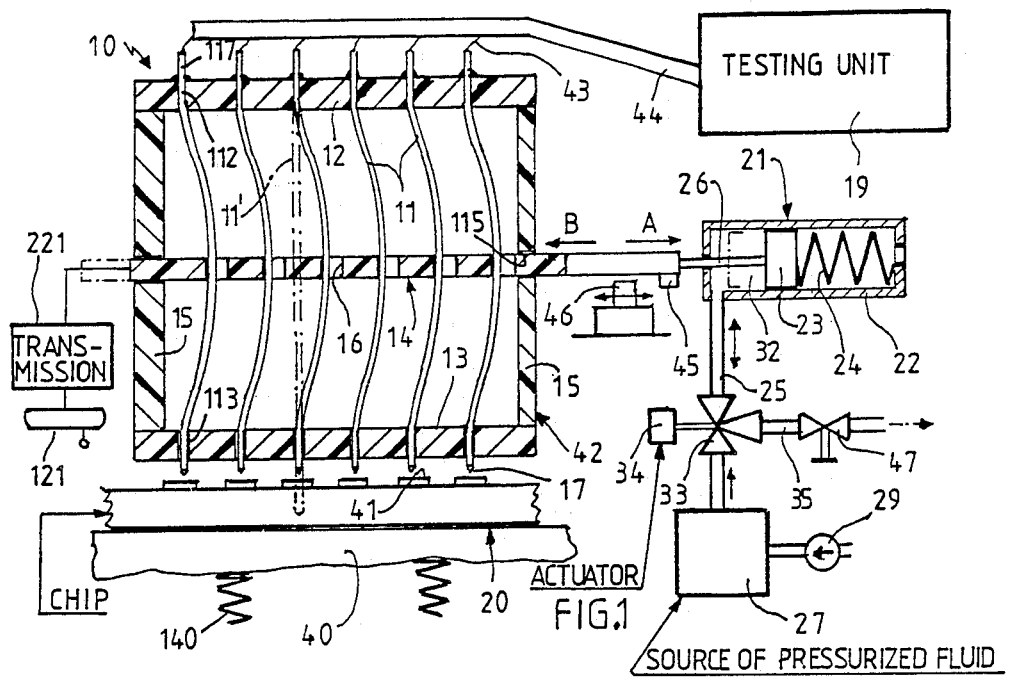
FIG. 1 is a partly elevational and partly vertical sectional view of an adapter which embodies one form of the invention and wherein the flexing member is shown in a position in which the median portions of the test probes are flexed in a predetermined direction to thereby maintain their front ends at or close to a minimum distance from the flexing member.

FIG. 1 shows a portion of an adapter 10 which embodies one form of the invention and can be put to use in an apparatus for testing so-called chips 20, circuit boards or analogous components having arrays of electric contacts 41 called pads. The illustrated adapter 10 comprises a hollow box-shaped housing 42 for an array of elongated flexible resilient test probes 11 (also called pins) which are straight (note the phantom-line pin 11') when not subjected to flexing stresses. For example, the pins 11 can be made (at least in part) of spring steel, a resilient copper-beryllium alloy or a like metallic material which conducts electric current. Each of the illustrated pins 11 consists of a single piece of metallic material, and at least the median portions of the pins (in the interior of the housing 42) preferably have a circular cross-sectional outline. Each pin 11 has a pointed, particularly conical, front end 17 which engages and bears against an adjacent contact 41 of the component 20 to be tested when the apparatus including the adapter 10 is in actual use. The diameters of the pins 11 need not exceed 1 mm; for example, the diameter of each pin can be in the range of 0.1 to 0.8 mm. However, it is within the purview of the invention to employ pins having diameters below 0.1 mm or more than 1 mm.

The component 20 to be tested is placed onto and, if necessary, attached to a positioning member 40 in the form of a table or plate which can be yieldably biased toward the adapter 10 by one or more springs 140 or in any other suitable way. The adapter 10 is designed in such a way that the conical front ends or tips 17 of the pins 11 invariably establish reliable electrical connections with the adjacent pads 41 when the component 20 is tested by a unit 19 of conventional design. At such time, the pins 11 establish electrical connections between the respective pads 41 and the corresponding conductors 43 which are connected to the rear ends 117 of the pins. The conductors 43 form part of an electric cable 44 which connects the pins 11 with the elements of the testing unit 19.

The illustrated component 20 in the form of a chip can be replaced with any other component the contacts of which are to be connected to a testing unit in order to ascertain the integrity or lack of integrity of the tested component. For example, the component to be tested can include an equipped or non-equipped circuit board, and the tips 17 of the pins 11 can be used to engage wires, legs of electrical components, surfaces adjacent or surrounding bores or holes in components to be tested, spot welded or spot soldered contacts and/or others.

The housing 42 of the adapter 10 includes a plate-like support or rear wall 12 which has parallel openings 112 in the form of holes or bores for the rear ends 117 of the pins 11 in a region which is remote from the pads 41 of the illustrated component 20. The rear ends 117 extend slightly beyond the respective openings 112 and are soldered or otherwise electrically connected to the respective conductors 43. The conductors 43 are insulated from each other. The unit 19 is ready to carry out a test as soon as the tips 17 of the pins 11 properly engage the respective pads 40 of the component 20 to be tested.

The support 12 is parallel to a plate-like front wall 13 of the housing 42. This front wall can be said to consist of a plurality of integrally connected bearings each of which has an opening 113 in the form of an elongated hole or bore for that portion of a pin 11 which is closely or immediately adjacent the respective tip 17. The openings 113 are parallel to each other and guide the respective pins 11 in regions which are remote from the regions where the rear ends 117 of the pins are held by the support 12. The connections between the rear ends 117 of the pins 11 and the support 12 are of such nature that the rear ends cannot move nearer to the front wall 13; it is presently preferred to fixedly connect the rear ends 117 to the support 12.

The support 12 and the front wall 13 are connected to each other by distancing elements 15 in the form of sidewalls which ensure that the support and the front wall remain parallel to each other. The parts 12 and 13 of the housing 42 are made of an insulating material, such as a ceramic or a plastic substance. This ensures that the pins 11 are reliably insulated from each other.

The openings 113 in the front wall 13 are straight cylindrical holes or bores having diameters only slightly greater than that of a pin 11 so that the front wall portions surrounding the openings 113 can be said to constitute friction bearings for the portions of pins 11 behind the respective tips 17.

The improved adapter 10 further comprises means for flexing the median portions of the pins 11 between the support 12 and the front wall 13. The flexing means comprises a plate-like flexing member 14 which is parallel to the front wall 13 and is confined to movements in and counter to the direction of arrow A by the sidewalls 15 of the housing 42. The flexing member 14 has parallel openings 16, e.g., in the form of slots which are elongated in the direction of the arrow A and each of which receives with some play the median portion of a discrete pin 11. Those portions of the sidewalls 15 which surround the cutouts or windows 115 to confine the flexing member 14 to movements in and counter to the direction of arrow A can be said to constitute friction bearings for the flexing member. The width of each opening 16 in a direction at right angles to the plane of FIG. 1 need not appreciably exceed the diameter of a pin 11; however, the width of each opening 16 in the direction of arrow A is preferably at least 1.5D and most preferably at least 3D. D is the diameter of the rod-shaped portion of a pin 11, i.e., of a portion which has a circular cross-sectional outline. FIGS. 1 to 4 show that the width of an opening 16 in the direction of arrow A can greatly exceed 3D . It is also within the purview of the invention to provide the flexing member 14 with circular openings 16 each having a diameter which at least equals but preferably exceeds or greatly exceeds 1.5D.

The means for flexing the pins 11 between the support 12 and the front wall 13 in the direction of arrow A further comprises means for moving the flexing member 14 in such direction. The illustrated moving means comprises a single-acting fluid-operated (e.g., pneumatic) motor 21 having a cylinder 22 for a reciprocable piston 23 connected to one end of a piston rod 26 the other end of which is permanently, separably or adjustably affixed to the flexing member 14 outside of the housing 42. The means for moving the flexing member 14 in a second direction (arrow B) counter to the first or predetermined direction (arrow A) comprises a coil spring 24 which is confined in the cylinder 22 and bears against the piston 23 opposite the piston rod 26. The illustrated fluid-operated (pneumatic or hydraulic) motor 21 constitutes but one form of means for moving the flexing member 14 in the direction of arrow A; for example, the flexing member can be moved in such direction by an electromagnet or by an electric motor. Still further, it is possible to employ a manually operable input element 121 (e.g., a foot pedal, a crank or a handwheel) which can move the flexing member 14 by way of a suitable step-down transmission 221 (e.g., a rack on the member 14 and a train of gears which receive torque from the input element 121). The manually operable means 121, 221 can be provided in addition to or in lieu of the motor 21.

The working chamber 32 of the cylinder 22 is connected with a source 27 of pressurized fluid by a conduit 25 which contains a three-way distributor valve 33. The supply of pressurized fluid (e.g., compressed air) in the source 27 can be replenished by a pump 29. The source 27 embodies or is connected with a suitable relief valve (not shown) which ensures that the pressure of confined fluid in the source 27 fluctuates very little or not at all.

An actuator 34 (e.g., a servomotor) is provided to actuate the valve 33 so that the latter can seal the path for the flow of pressurized fluid from the source 27 into the working chamber 32, that such path can be opened so that fluid which penetrates into the working chamber 32 can move the piston 23 in the direction of arrow A (whereby the spring 24 stores energy), or that the chamber 32 can be sealed from the source 27 while being free to communicate with a conduit 35 containing an adjustable throttle valve 47. If the fluid in the source 27 is air, the valve 47 can discharge spent fluid into the atmosphere. If the fluid in the source 27 is a hydraulic fluid, the conduit 35 can deliver spent hydraulic fluid to a sump, not shown.

The motor 21 is designed to flex the pins 11 to a predetermined maximum extend in response to movement of the piston 23, piston rod 26 and flexing member 14 in the direction of arrow A to a position which is determined by the coil spring 24 or by a suitable stop, now shown. Moreover, the rightmost position of the flexing member 14 can be determined by the aforementioned relief valve which controls the pressure of fluid in the source 27. Flexing of the median portions of pins 11 by the member 14 in the direction of arrow A causes the pins to store energy and to move their tips 17 in a direction toward the regions of the front wall 13 and support 12.

When the valve 33 is actuated by the servomotor 34 so that it permits pressurized fluid to escape from the working chamber 32 into the conduit 35 at a rate which is determined by selected setting of the throttle valve 47, the pins 11 dissipate energy until the tips 17 engage the adjacent pads 41 of the component 20 which is in a position for testing. When the flexed pins 11 are free to dissipate energy, they cause the flexing member 14 to move in the direction of arrow B i.e., counter to the direction of arrow A. Such movement of the flexing member 14 in the direction of arow B is assisted by the coil spring 24 which also dissipates energy.

The spring 24 can be omitted if the maximum force with which the tips 17 are to bear against the adjacent pads 41 of the component 20 to be tested should not or need not exceed the force which can be exerted by the pins 11 subsequent to flexing by the member 14 (i.e., in response to movement of the member 14 in the direction of arrow A) and following a reduction of pressure in the working chamber 32 of the motor 21 so that the flexed pins are free to dissipate energy until their tips 17 actually reach and are arrested by the adjacent pads 41.

The spring 24 can also be omitted if the illustrated motor 21 is replaced with a double-acting fluid-operated motor wherein the cylinder chamber to the right of the piston 23 can receive a pressurized fluid from the source 27 or from another source. Such double-acting motor then constitutes a means for moving the flexing member 14 in the direction of arrow A as well as a means for moving the flexing member in the direction of arrow B.

One mode of putting the improved adapter 10 to use with a suitable unit 19 to test a chip 20 or another component having a plurality of pads 41 or other types of contacts will be described with reference to FIGS. 1 and 2. The first step of the testing operation involves flexing of the pins 11 by moving the flexing member 14 to its right-hand end position in response to admission of pressurized fluid into the working chamber 32 of the cylinder 22. Six fully flexed pins 11 are shown in FIG. 1 by solid lines (it will be a appreciated that the adapter 10 can comprise hundreds or thousands or other numbers' of pins). Since the rear ends 117 of the pins 11 are secured to the support 12 and the pins are slidable in the respective openings 113 of the front wall 13, the tips 17 of all pins move toward or even into the respective openings 113 of the front wall when the flexing of median portions of the pins in the direction of arrow A is completed. As mentioned above, the pins 11 are or can be straight before the movement of the flexing member 14 in the direction of arrow A begins. The distances which the tips 17 of the pins 11 cover in response to flexing of median portions of the pins to the extent which is shown in FIG. 1 can be in the range of 0.5 to 3 mm, depending upon the size of the adapter, the diameters of the pins, the desired amounts of energy which are to be stored by the pins before the flexing member 14 is permitted or caused to move in the direction of arrow B, and the resistance of the spring 24 to further rightward movement of the piston 23. The overall length of the pins 11 is normally between 2 and 20 cm; however, it is equally possible to employ pins which are even shorter than 2 cm or longer than 20 cm.

The next step involves positioning the adapter 10 and/or table 40 in such a way that the tips of the fully flexed pins 11 are immediately or rather closely adjacent the respective pads 41. This can be achieved by moving the adapter 10 downwardly (as seen in FIG. 1), by moving the table 40 upwardly or by moving the table upwardly and moving the adapter downwardly. If the tips 17 are caused to actually engage the adjacent pads 41, they merely touch the pads or bear against them with a minimal or negligible force. At any rate, the force with which the tips 17 engage the contacts 41 (if they engage the contacts at all) is much smaller than the force which is required to move the tips 17 further toward the flexing member 14 and rear wall 12.

When the positioning step is completed, the table 40 and the housing 42 of the adapter 10 are maintained at a fixed distance from each other for the duration of the testing operation. If it is desired to subject the component 20 to be tested to a very gentle treatment, the table 40 can be biased from below by one or more springs 140 toward the position of FIG. 1 so that the pads 41 can yield to the pressure of the tips 17, at least to a certain degree. The extent to which the component 20 and the table 40 can yield in response to engagement of the pads 41 by the adjacent tips 17 can be minimal. It is presently preferred to omit or to deactivate the spring or springs 140, i.e., the positioning step should involve placing the table 40 and the front wall 13 at a fixed distance from each other so that the tips 17 of the flexed pins 11 barely contact or are immediately or very closely adjacent the respective pads 41.

A feature of the improved adapter 11 and of the means for positioning the tips 17 of the pins 11 and the pads 41 of a component to be tested is that the table 40 need not bias the contacts 41 against the adjacent tips 17; such function is performed by the elastically deformable pins 11, either alone or in combination with the flexing member 14 and coil spring 24 or other means for positively moving the member 14 in the direction of arrow B. Any axial shifting of the tips 17 by a component 20 on the table 40 would necessitate the exertion of a very large force. This can be avoided in accordance with the method of and with the apparatus of the present invention. When the tips 17 are caused to bear against the adjacent pads 41, either as a result of the tendency of pins 11 to dissipate stored energy subsequent to flexing of median portions of the pins to the positions of FIG. 1 or as a result of additional flexing of median portions of the pins in a manner to be described with reference to FIG. 3, they apply to the pads a force in the range of 30 to 300 cN per pin.

When the positioning step is completed and the distance between the table 40 and the front wall 13 is constant (or can be increased to a relatively small extent as a result of stressing of the spring or springs 140), the actuator 34 causes the valve 33 to connect the working chamber 32 of the motor 21 with the conduit 35 so that pressurized fluid is free to escape at a rate which is determined by the adjustable throttle valve 47 and the pins 11 are free to dissipate stored energy to move their tips 17 against the adjacent pads 41 or, if desired, to cause the tips 17 to penetrate into the adjacent topmost layers of the respective pads 41. The tips 17 are permitted to move downwardly and away from the flexing member 14 if they do not actually engage the respective pads 41 when the positioning step is completed or if the testing apparatus comprises one or more springs 140 which enable the table 40 to perform a small movement in a direction away from the front wall 13 of the housing 42.

The throttle valve 47 can be omitted if the valve 33 is designed in such a way that it can perform a desirable throttling action at a variable rate, i.e., to control the speed of movement of the flexing member 14 in the direction of arrow B as a result of dissipation of energy by the pins 11 and/or as a result of dissipation of energy by the coil spring 24.

Figure 2:
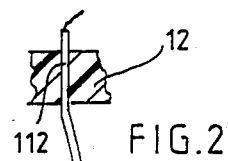
FIG. 2 is an enlarged view of a detail in FIG. 1, showing one of the probes in a position it assumes when its front end is caused to bear against the adjacent contact of a component to be tested exclusively as a result of the tendency of the probe to dissipate stored energy.

FIG. 2 shows the flexing member 14 in a position in which the median portion of the pin 11 is confined in the respective opening 16 with freedom of movement in the direction of arrow A or B, i.e., the flexing member does not contribute to the force which is applied by the pin 11 in a direction to urge its tip 17 against the adjacent contact 41. Thus, the median portion of the pin 11 which is shown in FIG. 2 is spaced apart from the leftmost and rightmost portions of the respective opening 16. If the opening 16 is a slot which extends in the directions of arrows A and B, the width of such slot need not appreciably exceed the diameter of the median portion of the pin 11. As can be seen in FIG. 2, the distance of the component 20 from the front wall 13 is such that the pin 11 cannot straighten out, i.e., it remains flexed when its tip 17 already engages the adjacent contact 41. The extent to which the median portion of the pin 11 remains flexed when its tip 17 engages the adjacent pad 17 determines the magnitude of the force acting between the tip and the pad and hence the reliability of electrical connection between such pad and the respective conductor 43. The extent to which the pins 11 of FIG. 1 are deformed by the flexing member 14 in the rightmost position of the flexing member is at least slightly greater than the extent of flexing of the pin 11 which is shown in FIG. 2. One of the reasons is that, in FIG. 1, the tips 17 of the pins 11 are spaced apart from the adjacent pads 41 even though the positioning step is already completed. In addition, some dissipation of energy by the pins 11 can be expected to take place, even if the tips 17 actually contact the respective pads 41 in the right-hand end position of the flexing member 14, when the member 14 is moved to the position of FIG. 2 because the tips 17 of the fully flexed pins are expected to penetrate, at least slightly, into the adjacent pads 41 when the flexing member 14 is caused or permitted to leave the right-hand end position of FIG. 1.

Figure 3:
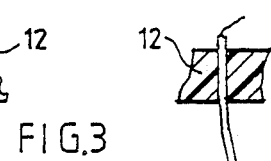
FIG. 3 is a similar enlarged view of a detail in FIG. 1, showing a test probe in a position in which its front end bears against a contact as a result of the tendency of the probe to dissipate energy which is stored as a result of flexing of an intermediate portion of the probe in a second direction counter to the predetermined direction.

If it is desired to increase the magnitude of forces which the tips 17 of the pins 11 apply against the adjacent pads 41 in the course of a testing operation, the flexing member 14 is permitted or caused to move to the position of FIG. 3, i.e., in the direction of arrow B and beyond the position of FIG. 2. This results in renewed flexing of median portions of the pins 11 but this time in the direction of arrow B. Such renewed flexing begins when the tips 17 of the pins 11 already bear against the adjacent contacts 41, i.e., when the pins can no longer dissipate energy which was stored during initial flexing (i.e., as a result of movement of the flexing member 14 to the right-hand end position of FIG. 1). As can be seen in FIG. 3, the surface bounding the rightmost portion of the respective opening 16 then bears against the illustrated pin 11 and causes the median portion of the pin to assume an undulate shape, namely a shape which the median portion assumes as a result of deformation caused by movement of the flexing member 14 in the direction of arrow B and beyond the position of FIG. 2. The flexing member 14 can be arrested in any one of a practically infinite number of positions in each of which it deforms the median portions of the pins 11 to a different extent, i.e., in each of which the tips 17 of the pins 11 bear against the adjacent pads 41 with a different force. The flexing member 14 can be arrested in a desired position when the spring 24 has fully dissipated the energy which was stored during movement of the piston 23 in the direction of arrow A or when the valve 33 and/or 47 prevents further escape of fluid from the working chamber 32. It will be readily appreciated that the force which must be applied to the flexing member 14 in order to ensure that the member 14 will assume or move even beyond the position of FIG. 3 (in the direction of arrow B) is only a small fraction of the force which would be required to achieve the same bias of the tips 17 upon the adjacent pads 41 by reducing the distance between the component 20 and the front wall 13 of the housing 42.

The extent of movability of the flexing member 14 in the direction of arrow B can be determined exclusively by the coil spring 24 or by stops which become effective before the coil spring 24 has been permitted to dissipate all of the stored energy, i.e., when the spring 24 would still be capable of moving the member 14 in the direction of arrow B. FIG. 1 shows a first stop 46 which is adjustable in directions indicated by a double-headed arrow and can intercept a stop 45 on the flexing member 14 or on the piston rod 26. Of course, it is equally possible to provide a stop (corresponding to the stop 46) in the working chamber 32 of the cylinder 22 to arrest the piston 23 when the latter assumes the phantom-line left-hand end position of FIG. 1. Still further, the stop 46 can be fixed and the stop 45 can be adjustably mounted on the flexing member 14 or on the piston rod 26.

Figure 4:
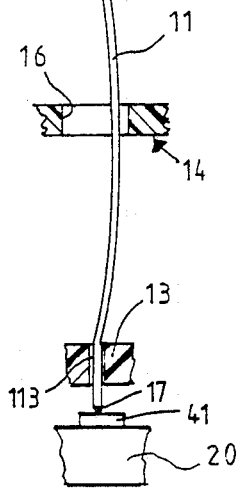
FIG. 4 is a similar enlarged view of a detail in FIG. 1, showing a test probe in a position in which its front end bears against the adjacent contact with a force smaller than the force which is applied by the probe of FIG. 2 or 3 because the flexing member prevents the probe from dissipating all of the stored energy.

The stops 45 and 46 can also serve to arrest the flexing member 14 in the position of FIG. 2 in which the member 14 does not influence the magnitude of the force with which the tips 17 of the pins 11 bear upon the adjacent pads 41. Still further, the stops 45, 46 can cooperate to terminate the movement of the flexing member 14 in the direction of arrow B at a time (FIG. 4) when the flexing member prevents the pins 11 from attempting to dissipate all of the energy which was stored by the pins as a result of movement of the member 14 to the right-hand end position of FIG. 1. In other words, the flexing member 14 of FIG. 4 assumes a position between the positions of FIGS. 1 and 2, i.e., the median portion of the pin 11 which is shown in FIG. 4 is deformed (flexed) to a greater extent than the median portion of the pin 11 of FIG. 2. Therefore, the force with which the tip 17 of the pin 11 shown in FIG. 4 bears upon the adjacent pad 41 is smaller than the force of the tip 17 which is shown in FIG. 2 and evidently much smaller than the force exerted by the tip 17 of FIG. 3. Otherwise stated, the retaining force which the flexing member 14 applies to the pin 11 of FIG. 4 (to thus prevent the pin from dissipating stored energy) is greater than zero in FIG. 4, is zero in FIG. 2 and is also zero in FIG. 3; however, in FIG. 3 the pin 11 is caused to generate an additional force because its median portion is flexed in the direction of arrow B prior to completion of dissipation of energy which was stored therein as a result of movement of the flexing member 14 to the right-hand end position of FIG. 1.

As mentioned above, the range of adjustability of the stop 46 for the stop 45 on the flexing member 14 can be selected in such a way that the stops 45, 46 can cooperate to terminate the movement of the flexing member 14 in the direction of arrow B when the flexing member assumes the position of FIG. 2, 3 or 4. The stops 45, 46 can select any one of a number of different positions in each of which the flexing member 14 is intercepted on its way in the direction of arrow B before it reaches the position of FIG. 2 so that the member 14 can select the force with which the tips 17 can bear upon the adjacent pads 41 (such force is smaller than the force which can be applied by the tip 17 of FIG. 2).

When the testing operation is completed, the table 40 is moved away from the housing 42 of the adapter 10 and/or vice versa, and the tested component 20 is replaced with a fresh component. The actuator 34 causes the valve 33 to admit pressurized fluid into the cylinder chamber 32 in order to return the flexing member 14 to the right-hand end position of FIG. 1 before the distance of the fresh component 20 on the table 40 from the front wall 13 of the housing 42 is reduced. The right-hand end position of the flexing member 14 can be determined by the actuator 34 (i.e., by properly timing the closing of the valve 33), by maximum compressibility of the spring 24 or by a suitable stop for the stop 45 or piston 23. If a stop is used, it is preferably adjustable so that the right-hand end position of the flexing member 14 can be selected from a range of such positions. The next testing operation is preceded by appropriate positioning of the fresh component 20 and front wall 13 relative to each other and by movement of the flexing member 14 in the direction of arrow B to the position of FIG. 2, 3 or 4, depending upon the desired magnitude of the force which the tips 17 of the pins 11 should apply to the adjacent pads 41.

The structure which is shown in FIG. 1 renders it possible to move the tips 17 gradually toward and into engagement with the respective pads 41. Such gradual movement can be achieved by regulating the rate of flow of pressurized fluid from the working chamber 32 in response to appropriate regulation of the valve 33 and/or 47. Alternatively, the adapter 10 can be caused to ensure abrupt engagement between the tips 17 of the pins 11 and a properly positioned component 20. All that is necessary is to abruptly move the valving element of the valve 33 to the fully open position so that the pins 11 can dissipate all of the energy which can be dissipated before the tips 17 are arrested by the adjacent pads 41 and, if the stops 45 and 46 permit it, the spring 24 can cause the flexing member 14 to move to the position of FIG. 3 to thereby cause the pins 11 to store additional energy as a result of flexing of their median portions in the direction of arrow B. The throttle valve 47 can be manipulated by hand or by remote control, e.g., in response to a signal from a control panel or the like, not shown.

The operation of the improved adapter is based on the recognition that a relatively small force is required to subject the flexible resilient pins 11 to a pronounced bending action if such bending is carried out in the direction of arrow A, i.e., in substantial parallelism with the front wall 13 of the adapter housing 42 and transversely of the pins. At any rate, the force which is required to move the flexing member 14 to the right-hand end position of FIG. 1 is a small fraction of the force which is required to push the contacts 41 against the adjacent tips 17 for the purpose of establishing an electrical connection which is as reliable as that between a contact and a pin in the condition as described with reference to FIG. 2, 3 or 4. This, in turn, contributes to simplicity and lower cost of the adapter and permits an increase of the output of the testing apparatus in which the adapter is put to use.

Gradual dissipation of energy which is stored by the pins 11 as a result of movement of the flexing member 14 to the end position of FIG. 1 is often desirable in connection with the testing of certain sensitive components. Gradual dissipation of energy can be ensured by proper manipulation of the valve 33 and/or 47, i.e., by controlling the speed of movement of the flexing member 14 in the direction of arrow B under the bias of median portions of the pins 11 and under the bias of the spring 24. Such movement can be controlled by the motor 21 in conjunction with the valve 33 and/or 47, or by hand by way of the part 121 and transmission 221.

However, if the nature of contacts on a component to be tested is such that a reliable electrical connection between the contacts and the respective conductors 43 can be established only as a result of sudden impact of the tips 17 against the adjacent contacts, the adapter 10 is set to ensure abrupt advancement of the flexing member 14 from the right-hand end position of FIG. 1 to the position of FIG. 2, 3 or 4 so that the tips 17 are even more likely to penetrate through oxide layers and/or layers of contaminants at those sides of the contacts which confront the plate 13 of the adapter housing 42. Such abrupt movement of the flexing member 14 in the direction of arrow B will enhance the likelihood of the establishment of reliable electrical connections between the contacts of the component to be tested and the conductors 43 irrespective of whether the flexing member 14 is arrested in the position of FIG. 2, is caused to move all the way or even beyond the position of FIG. 3, or is arrested in the position of FIG. 4 to thus prevent the pins 11 from bearing against the adjacent contacts with a force which is as large as that of the pin 11 shown in FIG. 2 or 3. Abrupt movement of the flexing member 14 in the direction of arrow B is particularly effective if the movement of flexing member to the end position of FIG. 1 has resulted in such positioning of the pins 11 with reference to the component to be tested that the tips 17 of the pins are spaced apart from the adjacent contacts.

The mode of establishing electrical connections between the tips 17 of the pins 11 and the contacts of a component to be tested in a manner as described with reference to FIG. 4 will be relied upon if the component is highly sensitive and should not be acted upon by a large force. The likelihood of avoiding damage to such highly sensitive components can be reduced still further by ensuring that the movement of the flexing member 14 from the end position of FIG. 1 to the position of FIG. 4 is gradual.

As already mentioned above, the tips 17 of the pins 11 can be fully retracted into the respective openings 113 in response to movement of the flexing member 14 to the end position of FIG. 1. This renders it possible to move the contacts 41 of a component 20 into direct engagement with the exposed side of the front wall 13. However, and as actually shown in FIG. 1, it is equally possible to select the extent of movement of the flexing member 14 in the direction of arrow A in such a way that the tips 17 of the pins 11 remain at least partially exposed when the flexing member reaches its right-hand end position.

The feature that a relatively small force suffices to flex a large number of pins 11 by means of the flexing member 14 renders it possible to move the flexing member without resorting to a motor, e.g., by way of the aforediscussed foot pedal, crack or handwheel 121. The transmission 221 is designed to reduce the effort which must be exerted by the person actuating the part 121 for the purpose of moving the flexing member 14 to the end position of FIG. 1 (arrow A) or to the position of FIG. 3 (arrow B).

An important advantage of the adapter 10 and of a testing apparatus which embodies the adapter is that a relatively small force is required to flex the pins 11. Another important advantage is that the person in charge can select the speed at which the flexing member 14 can move in the direction of arrow B, i.e., the rate at which the tips 17 of the pins 11 can move toward engagement with the adjacent pads 41. A further important advantage is that the force which the tips 17 of the pins 11 apply to the adjacent pads 41 can be varied within a wide range by the simple expedient of moving the flexing member 14 to the position of FIG. 2, by terminating the movement of the flexing member in the direction of arrow B ahead of the position of FIG. 2 (see FIG. 4), or by causing the flexing member to continue its movement in the direction of arrow B beyond the position of FIG. 2 (see FIG. 3). Such selection of forces which are applied by the tips 17 of the pins 11 can be made without the need for any structural changes in the adapter and/or its connection with the testing unit 19.

Testing units which can be used in the apparatus of FIG. 1 for evaluation and processing of signals from test probes 11 are embodied in test systems known as atg A 1000/500 which are manufactured and distributed by atg electronic GmbH, Wertheim-Reicholzheim, Federal Republic of Germany.

Without further analysis, the foregoing will so fully reveal the gist of the present invention that others can, by applying current knowledge, readily adapt it for various applications without omitting features that, from the standpoint of prior art, fairly constitute essential characteristics of the generic and specific aspects of my contribution to the art and, therefore, such adaptations should and are intended to be comprehended within the meaning and range of equivalence of the appended claims.

I claim:

1. A method of contacting circuit boards, and analogous components having a plurality of electric contacts with elongated flexible resilient test probes each of which has a contact-engaging front end, comprising the steps of reciprocably guiding the probes in first regions adjacent the front ends; supporting the probes in second regions remote from the front ends against movement toward the first regions; flexing the probes intermediate the first and second regions in a predetermined direction with a predetermined force to thereby retract the front ends toward the second regions and to cause the thus flexed probes to store energy; positioning the retracted front ends and the contacts of the component to be tested close to or in actual engagement with each other; and at least reducing said force to thus enable the front ends to bear against the contacts of the component to be tested due to the tendency of probes to dissipate stored energy.

2. The method of claim 1, wherein said force reducing step includes effecting a movement of the probes intermediate the first and second regions in a second direction counter to said predetermined direction.

3. The method of claim 1, wherein said force reducing step includes reducing the force to zero so that the dissipation of energy which is stored in the course of said flexing step is terminated exclusively as a result of engagement of front ends of the probes with the contacts of the component to be tested.

4. The method of claim 1, wherein said force reducing step includes reducing the force to zero so that the probes are free to dissipate energy which is stored in the course of said flexing step and to thereby urge the front ends against the contacts of the component to be tested, and further comprising the step of thereupon applying to the probes a second force in a second direction substantially counter to said predetermined direction to flex the probes between the first and second regions and to cause the probes to store additional energy.

5. The method of claim 1, wherein said force reducing step includes reducing the force by less than 100 percent so that the front ends bear against the contacts of the component to be tested as a result of partial dissipation of energy by the probes.

6. The method of claim 1, further comprising the step of maintaining the component to be tested at a fixed distance from the second regions in the course of said force reducing step.

7. The method of claim 1, further comprising the step of yieldably biasing the contacts of the component to be tested against the front ends during and upon completion of said force reducing step.

* * * * *